(12) United States Patent
Streit

(10) Patent No.: US 8,222,907 B2
(45) Date of Patent: Jul. 17, 2012

(54) ARCHITECTURE AND METHOD TO DETERMINE LEAKAGE IMPEDANCE AND LEAKAGE VOLTAGE NODE

(75) Inventor: Lawrence C. Streit, Noblesville, IN (US)

(73) Assignee: Analog Devices, Inc., Norwood, MA (US)

( * ) Notice: Subject to any disclaimer, the term of this patent is extended or adjusted under 35 U.S.C. 154(b) by 298 days.

(21) Appl. No.: 12/748,331

(22) Filed: Mar. 26, 2010

(65) Prior Publication Data

US 2010/0259281 A1 Oct. 14, 2010

Related U.S. Application Data

(60) Provisional application No. 61/167,724, filed on Apr. 8, 2009.

(51) Int. Cl.
*G01R 27/00* (2006.01)
(52) U.S. Cl. .................. 324/600; 324/525; 324/606
(58) Field of Classification Search .................. None
See application file for complete search history.

(56) References Cited

U.S. PATENT DOCUMENTS 4,472,676 A * 9/1984 Eichmann et al. ............ 324/509

OTHER PUBLICATIONS

SAE International, Surface Vehicle Recommended Practice, J1766, Revised Apr. 2005.
UN Economic and Social Council, ECE/TRANS/WP.29/2010/52, pp. 1-45, Dec. 22, 2009.

* cited by examiner

*Primary Examiner* — Minh N Tang
(74) *Attorney, Agent, or Firm* — Kenyon & Kenyon LLP

(57) ABSTRACT

A circuit, system, machine-readable storage medium and method for detecting the presence of a leakage path in a multi-cell voltage source is described. The system includes a detection circuit, the detection circuit having a first, second and third amplifiers, a first input of the first amplifier connected to a first terminal of the voltage source and the first input of the second amplifier connected to a second terminal of the voltage source, a second input of each of the first and second amplifiers connected to a reference capacitor, and an output of each of the first, second and third amplifiers connected to a respective first, second and third outputs of the detection circuit; and a processor having inputs connected to the first and second outputs of the detection circuit.

10 Claims, 4 Drawing Sheets

100

200

300

400

US 8,222,907 B2

ARCHITECTURE AND METHOD TO DETERMINE LEAKAGE IMPEDANCE AND LEAKAGE VOLTAGE NODE

This application claims the benefit of U.S. Provisional Patent Application Ser. No. 61/167,724 filed on Apr. 8, 2009, and is related to commonly-assigned U.S. Non-provisional patent application Ser. No. 12/748,117 filed on Mar. 26, 2010, the entire contents of each of which are incorporated herein by reference.

BACKGROUND

The present invention is directed to a circuit and method for detecting the presence of leakage impedance and determining its location within a high voltage stack of direct current voltage sources (e.g., a battery). Leakage impedance is an error condition where a battery in a battery stack, such as in a hybrid vehicle or an isolated remote power source, is experiencing a fault condition, for example, caused by faulty circuit components and/or faulty insulation or the like. The leakage impedance indicates that a circuit path from the floating battery to chassis of the vehicle is formed. This can be a potentially life-threatening hazard. Previous attempts to make determinations of leakage impedance and location of leakage voltage nodes were costly and/or had measurement errors that were unacceptable. Accordingly, there is a need for a low cost and more precise alternative to the prior art systems.

DETAILED DESCRIPTION

Figure 1:
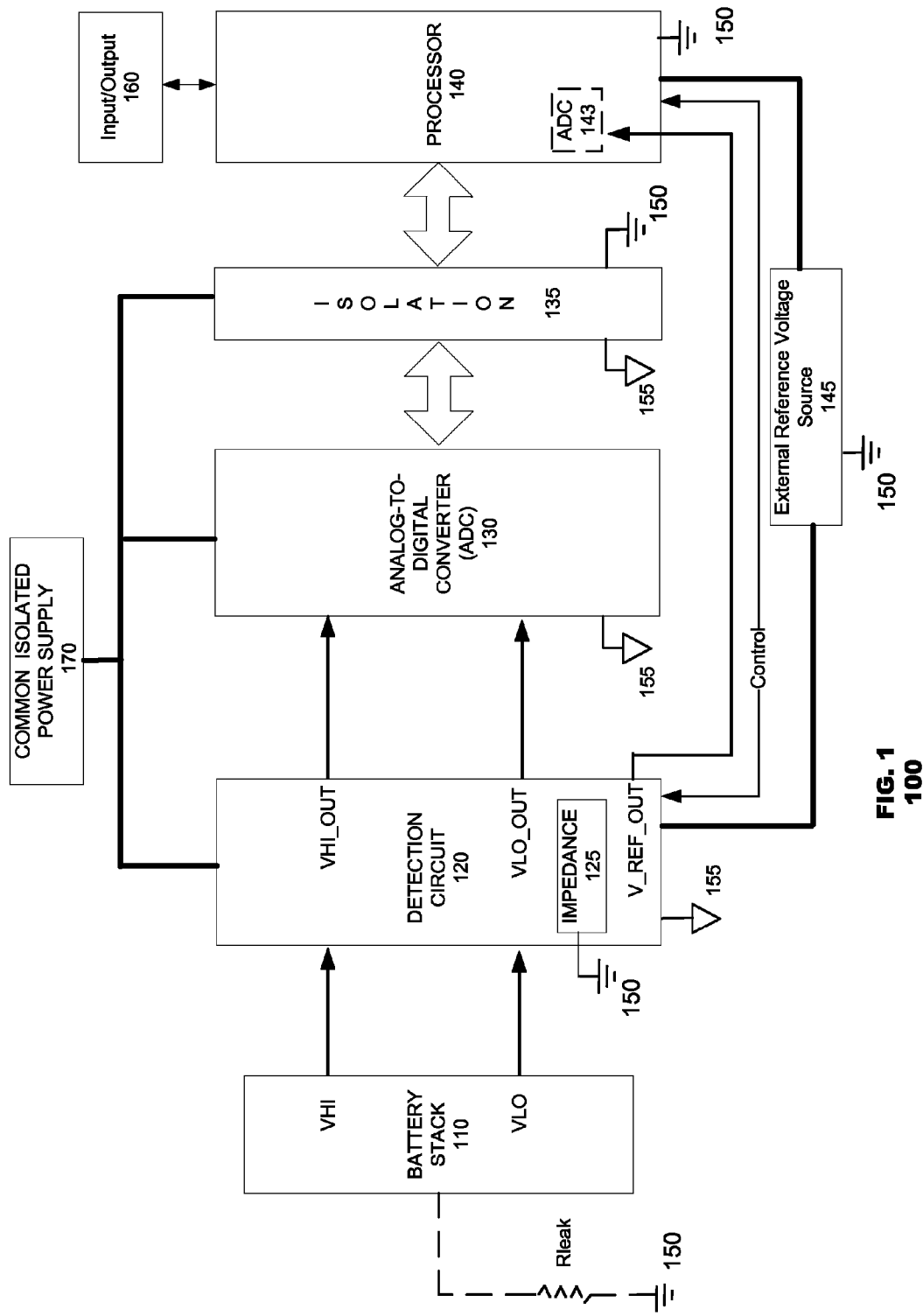
FIG. 1 illustrates a general implementation according to an embodiment of the present invention.

Embodiments of the present invention provide a machine-readable storage medium comprising program instructions executable by a processor and a method for identifying a presence of a leakage path in a multi-cell voltage source. The voltage of the floating voltage source may be sampled using a pair of amplifiers connecting in inverting configurations. Each of the pair of amplifiers may output an output signal. A reference voltage relative to a reference ground potential may be sampled. The sampled amplifier output signals and the sampled reference voltage may be stored in a memory. The voltage of the floating voltage source and the reference voltage may be resampled. Using the sampled and resampled values, values of a leakage impedance, and an offset voltage may be calculated. The calculated values of the leakage impedance and offset voltage may be compared with threshold values for each of the leakage impedance and offset voltage. Based on the result of the comparison, a notification may be generated indicating that a threshold value of any one of the leakage impedance and offset voltage has been exceeded.

Embodiments of the present invention provide a system for determining a leakage impedance, a leakage voltage and measuring voltage of a battery source. The system may include a voltage source, a detection circuit, and a processor. The voltage source may be formed from multiple voltage cells. The detection circuit may include a first amplifier and a second amplifier. A first input of the first amplifier may be connected to a first terminal of the voltage source and the first input of the second amplifier may be connected to a second terminal of the voltage source. A second input of each of the first and second amplifiers may be connected to an isolated ground. An output of each of the first and second amplifiers may be connected to a respective first and second output of the detection circuit. The processor may sample the outputs of each of the first and second amplifiers and the reference ground potential to identify at least one of a leakage impedance and an offset voltage and a voltage of the voltage source.

Embodiments of the present invention provide a circuit for detecting a leakage impedance and leakage voltage of a voltage source having a plurality of voltage sources. The circuit may include three inputs, three amplifiers, three outputs and inputs for an isolated power supply. A first input of the two inputs may be connected to a positive terminal of the voltage source and a second input of the two inputs may be connected to a negative terminal of the voltage source. The non-inverting input of each of the pair of amplifiers may be connected to a reference capacitor. The output of each of the amplifiers may be connected to a respective one of the two outputs of the circuit. A third amplifier may have a first input connected to a reference resistor and a second input may be connected to a reference voltage source. An output may be connected to a third output of the circuit. The reference capacitor may be connected to a reference ground potential. The inputs from the isolated power supply may be connected to power supply terminals of the first amplifier and the second amplifier to provide power to the first and second amplifiers. The power supplied by the isolated power supply may be with reference to an isolated ground potential that may be different than the reference ground potential.

The exemplary system 100 illustrated in FIG. 1 may include a battery stack 110, and a detection circuit 120, an analog-to-digital (ADC) converter 130, an isolation device 135, a processor 140, an external voltage supply 145, a isolated power supply 170 and inputs/outputs 160 according to an embodiment of the present invention. The battery stack 110 may be comprised of a number of stacked cells that may form a voltage source used in, for example, a hybrid electric vehicle or an electric vehicle. The battery stack 110 may be a DC voltage source, and may have a positive terminal (labeled VHI) and a negative terminal (labeled VLO). The battery stack 110 may not be connected electrically to the chassis 150 of the vehicle. The battery stack 110 may be called a "floating" voltage source when not connected to the chassis 150. In such a case, the chassis 150 may be considered a reference ground potential. A fault condition may occur in the battery stack 110 due to a faulty circuit component, faulty insulation and the like, which may result in the presence of a leakage path, shown in phantom, between the battery stack 110 and the chassis 150. The leakage path may have a leakage impedance Rleak, and when leakage current is present, a leakage voltage VLEAK may be present across leakage impedance Rleak.

The detection circuit 120 may be connected to the battery stack 110 to condition the voltages VHI and VLO. The detection circuit 120 may comprise an impedance 125 (which will be explained in more detail below) that may be electrically connected to the chassis 150. In addition, the detection circuit 120 may also have a connection to an isolated ground 155. The detection circuit 120 may be configured to condition voltages VHI, VLO and V_REF and output signals VHI_OUT, VLO_OUT and V_REF_OUT that are, respectively, representative of the measured voltages. The detection circuit 120 may be implemented as a stand-alone circuit component, or incorporated in an application specific standard product (ASSP).

The signals VHI_OUT and VLO_OUT may be output from the detection circuit 120 to an analog-to-digital converter (ADC) 130, and the signal V_REF_OUT may be directly sampled by processor 140 via an analog-to-digital converter circuit 143. The ADC 130 may convert received output signals from an analog signal to a digital signal, and output through isolation 135 to a processor 140 for processing. The processor 140 may store the values of the signals over time, and use the supplied signals to determine whether a leakage impedance Rleak is present, and the related value of a leakage voltage and the leakage impedance Rleak. Although, the ADC 130 is shown in the illustrated example located prior to the isolation, one of skill in the art may reconfigure the exemplary arrangement by placing the ADC 130 in the location of the processor 140 and placing the processor 140 in the location of the ADC 130. The isolation 135 remaining between the processor 140 and the ADC 130.

The processor/controller 140 may include a processor and a memory, or have access to a memory, for storing data measured by the processor such as voltage signals output by the ADC 130 or voltage signals output via an ADC 143 directly from the detection circuit 120. In addition, the memory may store pre-programmed data and computer program instructions. The memory may also be accessed for reading and writing functions via input/outputs 160. The processor/controller 140 may be a processor or controller, already available that performs other system processing and/or control, or processor 140 may forward the digital signals to another processor for processing. Alternatively, the processor/controller 140 may be implemented as an FPGA, gate array or any other known method of providing the processing functions. The processor/controller 140 may control the operation of the external voltage source 145. Optionally, the processor 140 may connect to input/output devices 160 to present battery stack 110 status, alarm conditions or other information, in an audible, tactile and/or a visual presentation, to an output device, such as a monitor or speaker. An alarm condition may be, for example, when the magnitude of the derived leakage impedance and/or derived leakage voltage exceeds a predetermined threshold or presents a hazard. An input device may be a touch screen, a button, a keypad, or the like.

The isolation device 135 provides electrical isolation of the processor/controller 140 from the battery stack 110, the detection circuit 120 and the ADC 130. The isolation device 135 may have connections to both the chassis 150 and isolated ground 155. The chassis 150 is electrically isolated from the isolated ground 155.

Various voltage sources may provide either signal voltages or supply power to the system 100. For example, a isolated power supply 170 may provide power to the detection circuit 120, the ADC 130, and the isolation device 135. The isolated power supply 170 may be connected to isolated ground 155. Another voltage source may be an external reference voltage source 145 that may be external to, or part of, the processor/controller 140. The external reference voltage source 145 may be under control of the processor/controller 140, and may output a signal with reference to chassis 150 in the form of a sinusoid, ramp signal, a step signal or other form of voltage signal pattern to the detection circuit 120. The operation of the system 100 will be described in more detail with reference to FIGS. 3 and 4. The above illustrated system configuration is only an example, and the system may be implemented in other configurations as known by those of skill in the art.

Figure 2:
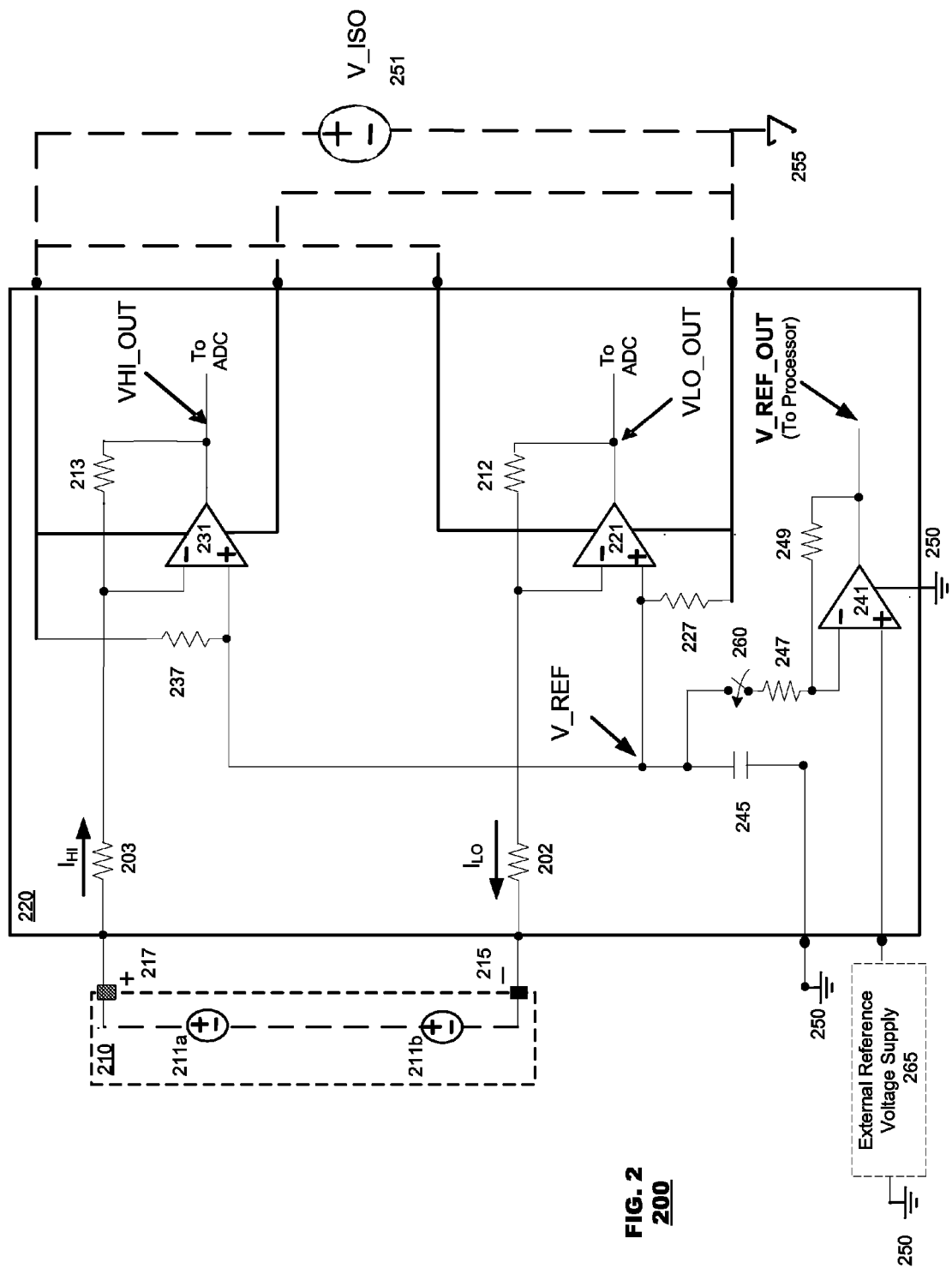
FIG. 2 illustrates an exemplary circuit according to an embodiment of the present invention.

A more detailed description of an exemplary configuration of the detection circuit in combination with a battery stack will be made with reference to FIG. 2. The detection circuit 220 in FIG. 2 is shown connected to a battery stack 210. In the example of FIG. 2, the battery stack 210, shown in phantom, is illustrated in an exemplary operating condition in which a leakage impedance is not present.

As explained above, the battery stack 210 may comprise a plurality of battery cells. For ease of explanation, the battery stack 210 is modeled as a pair of voltage sources 211a and 211b with the positive (+) terminal connected to node 217 and the negative terminal (−) connected to node 215. The battery stack 210 may have a total battery voltage that is equal to the sum of voltages provided by voltage sources 211a and 211b, respectively.

The detection circuit 220 may include several inputs, several outputs, amplifiers 221, 231, and 241, a pair of input resistors 202, 203, feedback resistors 212, 213, and 249, a pair of bias resistors 227, 237, a reference capacitor 245, a reference resistor 247, and a switch 260. Each of the amplifiers 221, 231 have inputs, power supply connections and an output as is known in the art. The amplifiers 221, 231 may each have a non-inverting input terminal connected to the reference capacitor 245, and, respectively, to one terminal of each of the bias resistors 227 and 237. Each of the amplifiers 221 and 231 may be connecting in an inverting configuration with a feedback resistor 212, 213 connected to their respective inverting inputs. Bias resistor 227 and 237 may be sized to bias the non-inverting inputs of the amplifiers 221, 231 to a potential relative to the isolated ground 255. Of course, other components or devices may be substituted for bias resistors 227 and 237 to provide the same function.

A first input of the detection circuit 220 may connect to the positive (+) terminal 217 of battery stack 210, and a second input may connect to the negative (−) terminal 215 of the battery stack 210. A third input of the detection circuit 220 may connect to the chassis 250 of the vehicle in which the battery stack 210 may be located. The first input of the detection circuit 220 may be connected to a first terminal of the input resistor 203. The second input of the detection circuit 220 may be connected to a first terminal of the input resistor 202. The third input may be connected to a first terminal of reference capacitor 245, and be connected to the negative supply node of the amplifier 241.

A second terminal of the input resistor 203 may connect to the inverting input of the amplifier 231. Similarly, a second terminal of resistor 202 may connect to the inverting input of the amplifier 221. Since the amplifiers 221 and 231 may be configured in an inverting configuration, the feedback resistors 212 and 213 may be connected to both the inverting input and the output of the respective amplifiers 221 and 231. The input resistors 202 and 203 may be of equal resistance value, and may have a resistance value of approximately 5-20 Megaohms depending upon the resistance value of the reference resistor 247. The feedback resistors 212 and 213 may have a resistance value 1-3 orders of magnitude smaller than the resistance values of input resistors 202 and 203. The feedback resistors 212 and 213 may have the same resistance values.

In summary, the inverting input of the amplifier 221 may be connected to resistor 202 and feedback resistor 212, the non-inverting input of the amplifier 221 may be connected to chassis 250 via reference capacitor 245, and the output of the amplifier 221 may be connected to the second terminal of feedback resistor 212. The amplifier 221 may output an analog signal VHI_OUT to an analog-to-digital converter (ADC) (not shown) for conversion to a digital signal.

Similarly, the amplifier 231 may have an inverting input connected to input resistor 203 and feedback resistor 213, the non-inverting input may be connected to chassis 250 via reference capacitor 245, and the output of the amplifier may be connected to a second terminal of feedback resistor 213. The amplifier 231 may output an analog signal VHI_OUT to an analog-to-digital converter (ADC) (not shown) for conversion to a digital signal.

A first terminal of reference capacitor 245 may be connected to the third input of the detection circuit 220, which may be connected to chassis 250. The second terminal of the reference capacitor 245 may be connected to the non-inverting input of amplifier 221 and to the non-inverting input of amplifier 231. The capacitance value of reference capacitor 245 may have an approximate capacitance value similar to high voltage capacitors used in hybrid vehicle systems.

Also connected to the second terminal of the reference capacitor 245 may be a switch 260. The switch 260 may be controlled by a processor/controller (not shown). The switch 260 may be a transistor, MOSFET, relay, photo-MOS or other switch as is known in the art. The switch 260 may be actuated by a signal from the processor/controller (not shown). The switch 260 when closed, may complete a circuit path connecting a first terminal of a reference resistor 247, and the reference amplifier 241, which is configured in an inverting configuration, to the second terminal of the reference capacitor 245 and the non-inverting inputs of amplifiers 221 and 231. A second terminal of the reference resistor 247 and a first terminal of the feedback resistor 249 may be connected to an inverting input of the reference amplifier 241. An external reference voltage supply 265 that may be controlled by a processor/controller (not shown) may be connected to the non-inverting input of the reference amplifier 241. An output of reference amplifier 241 may be connected to the second terminal of feedback resistor 249 and to an output of the detection circuit 220. The output of reference amplifier 241, output signal V_REF_OUT, may also be provided to the processor/controller (not shown). The reference amplifier 241 has a power supply with reference to chassis 250 potential.

The detection circuit 220 may also be connected to, or include, a isolated power supply 251. The isolated power supply 251 may supply both negative and positive power to the amplifiers 221 and 231, and be connected to an isolated ground 255. The positive (+) terminal of the isolated power supply 251 may connect to the positive power supply terminal of both amplifiers 221, 231 and to a first terminal of a bias resistor 237. A second terminal of the bias resistor 237 may connect to the non-inverting terminal of amplifier 231, and to reference capacitor 245 and switch 260. The negative (−) terminal of the isolated power supply 251 may connect to the negative power supply terminals of both amplifiers 221 and 231, and a first terminal of a bias resistor 227. The second terminal of bias resistor 227 may connect to the non-inverting input of 221.

With reference to FIG. 2, the currents $I_{HI}$ and $I_{LO}$ may be substantially equal. Since input resistors 202 and 203 may be matched, the voltage drop across input resistor 202 is equal to, but of opposite polarity to, the voltage drop across input resistor 203. This leaves an equal voltage potential, but of opposite polarity, on the respective nodes 215 and 217 relative to chassis 250. The battery stack 210 voltage may be substantially equal to the sum of the voltage drops across the input resistors 202 and 203.

In the illustrated example, amplifier 221 may output a voltage VLO_OUT, which may have a positive voltage potential proportional to the difference between the voltage V_REF at the second terminal of reference capacitor 245 and the voltage potential at (negative terminal) node 215. Effectively, the voltage signal VLO_OUT relative to isolated ground 255 may be equal to the product of current $I_{LO}$ and the resistance value of feedback resistor 212.

Amplifier 231 may output a voltage VHI_OUT, which may have a negative potential and may be proportional to the difference between the voltage V_REF at the second terminal of reference capacitor 245 and the voltage potential at (positive terminal) node 217. Effectively, the voltage signals VHI_OUT relative to isolated ground 255 may be equal to the negative product of the current $I_{HI}$ and the resistance value of feedback resistor 213. The voltage signals VLO_OUT and VHI_OUT may remain substantially constant, and may be output to an ADC (not shown). The ADC may convert the signals to a digital signal, which may be sampled by a processor. The sampling may occur at predetermined intervals, which may change based on changes in the sampled values.

Each of the voltages VLO_OUT and VHI_OUT may be output to either an analog-to-digital converter (ADC) (not shown) for conversion to a digital value that may be output to a processor/controller (not shown) for processing, and the voltage V_REF_OUT may be output directly to the processor/controller. These values VLO_OUT, VHI_OUT, and V_REF_OUT may be used to determine whether a leakage impedance and/or leakage voltage is present, and to determine the battery stack 210 voltage (e.g., the sum of voltage sources 211a plus 211b).

The exemplary configuration of the detection circuit 220 may or may not incorporate the isolated power supply 251 or a analog-to-digital converter (not shown) when the detection circuit is implemented as a stand-alone circuit component, or incorporated in an application specific standard product (ASSP) with an analog-to-digital converter.

Figure 3:
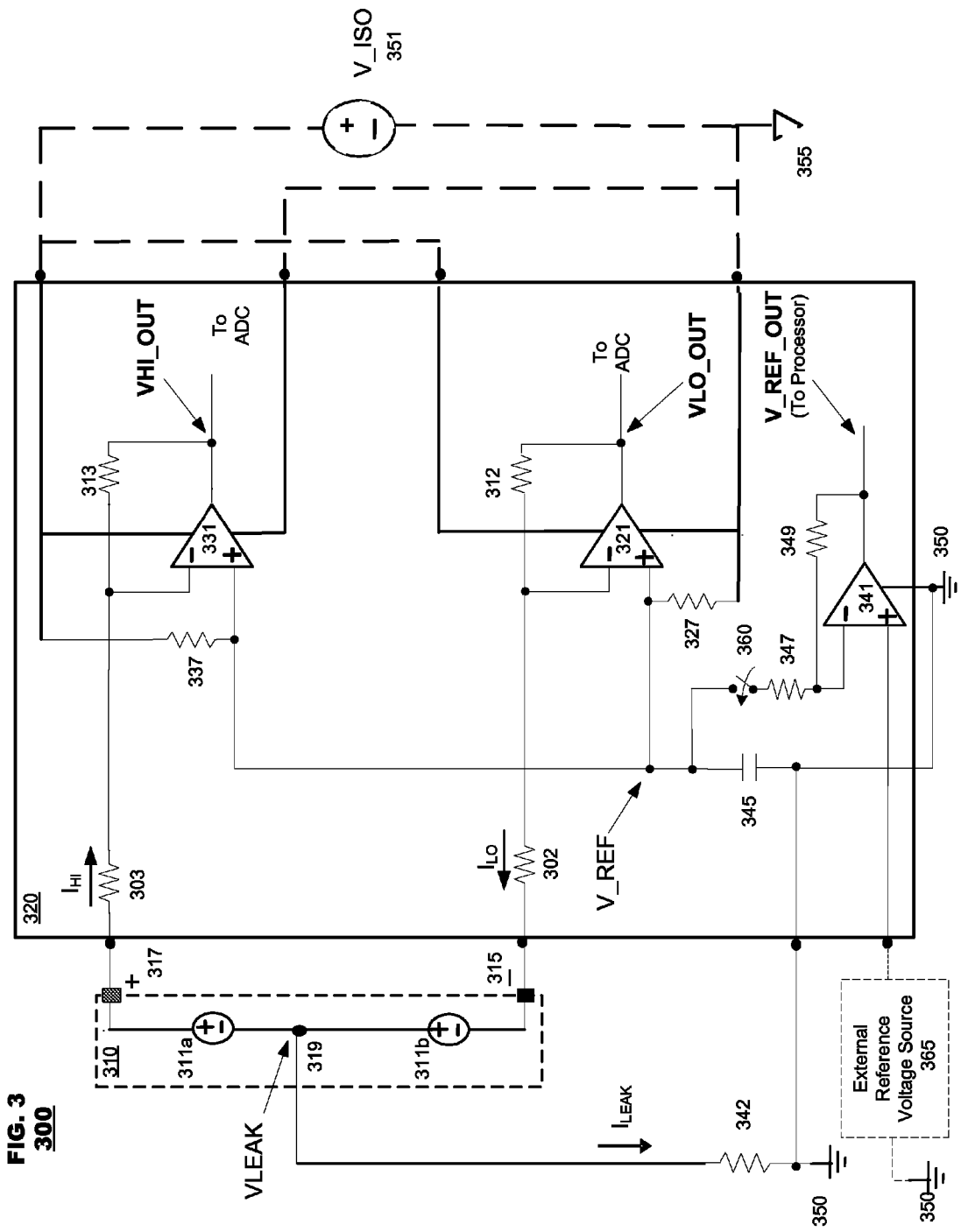
FIG. 3 illustrates the exemplary circuit of FIG. 2 and an implementation according to an embodiment of the present invention.

The detection of a leakage impedance and leakage voltage in the battery stack 210 will be described in more detail with reference to FIG. 3. The topology of the detection circuit 320 is substantially the same as detection circuit 220 described above with respect to FIG. 2, so further description will not be provided with respect to its configuration. FIG. 3 illustrates a battery stack 310 with a leakage impedance path modeled by leakage resistance 342 from an arbitrary leakage voltage (VLEAK) node 319 in battery stack 310 to chassis (reference ground potential) 350. Node 319 can occur anywhere within the battery stack 310, and is shown at an arbitrary location. The leakage impedance path is represented by a leakage resistance 342, and when a leakage current $I_{LEAK}$ is present from leakage voltage node 319 to chassis 350, a leakage voltage VLEAK may be present. Leakage impedance 342, leakage voltage VLEAK and leakage current $I_{LEAK}$ can have various values that may or may not change over time.

The battery stack 310 is modeled with two voltage sources 311a and 311b. In certain circumstances, a leakage path may develop that is at an electrical mid-point of the battery stack 310, or the leakage path may be symmetrical. In other words, the voltage between the leakage voltage VLEAK node 319 and node 317 may be equal to the voltage of voltage source 311a, or half of the battery stack 310 voltage, and the voltage between node 319 and node 315 may be equal to the voltage of voltage source 311b, or the other half of the battery stack 310. In this case, the processor (not shown) may not have enough information to determine that a symmetrical leakage path is present.

Reviewing FIG. 3 under the assumption that leakage current $I_{LEAK}$ passes through leakage impedance Rleak 342 and chassis 350, the leakage current $I_{LEAK}$ may be input to the detection circuit 320 via the detection circuit connection to chassis 350. When leakage current $I_{LEAK}$ through leakage impedance 342 is initially present, the current $I_{LEAK} \approx I_{LO} - I_{HI}$. Also, the switch 360 is open, and the voltage V_REF_OUT is equal to the voltage provided by external voltage source 365.

Recall that the voltage V_REF in the absence of a leakage condition may maintain a voltage that is substantially equal to chassis 350 potential, or substantially zero (0) volts. When a leakage condition occurs and becomes evident due to leakage voltage node 319 in the battery stack, an offset voltage between the battery stack 310 voltage and the chassis 350 potential is present. Due to the location of node 319 (which is VLEAK) and the value of VLEAK, the voltage sources 311a or 311b may be unbalanced. For example, battery stack 310 may have a voltage of 100 volts without a leakage condition, where voltage source 311a provides 50 volts and voltage source 311b provides 50 volts, or in other words, the voltages sources 311a and 311b are symmetrical. However, with an asymmetrical leakage condition present, if the voltage of voltage 311a plus the voltage of 311b is equal to 100 volts, the individual voltage source 311a may be 25 volts, while individual voltage source 311b may be 75 volts. Each voltage source 311a and 311b may have a voltage that is offset by 25 volts from its normal 50 volts. This offset of voltage relative to symmetry may be referred to as the offset voltage. Returning to the operation of the detection circuit 320 under the assumption that a leakage path is present and leakage current ILEAK is flowing. The switch 360 may initially be open. To begin the detection of a leakage path, the processor may output a control signal causing the switch 360 to close. When a leakage current $I_{LEAK}$ flows due to the voltages VLEAK at node 319 and V_REF, and currents $I_{LO}$ and which were previously balanced (same value) become unbalanced. The reference capacitor 345 begins to charge due to the current $I_{LEAK}$. After the reference capacitor 345 charges, the current $I_{LEAK}$ passes through reference resistor 347 and reference feedback resistor 349. The $I_{LEAK}$ current through the resistors 347 and 349 causes a voltage to be present at the output of amplifier 341. After a predetermined time, the output of amplifier 341 is sampled by the processor (not shown). The processor may sample the output of amplifier 341 via an ADC, such as ADC 143 shown in FIG. 1. The representative reference voltage V_REF_OUT may be generated by a difference between an external reference voltage provided by external voltage source 365 and the voltage over reference feedback resistor 349, or a value of [$I_{LEAK}$ times the resistance value of feedback resistor 349]. In the presence of leakage current $I_{LEAK}$, the voltage V_REF_OUT may be different from the external reference voltage applied to the non-inverting input of the amplifier 341. Upon determining that V_REF_OUT does not correspond to the applied external reference voltage, the processor may generate a control signal to open the switch 360. Alternatively, if V_REF_OUT corresponds to the applied external reference voltage, the processor may change the applied external reference voltage to a different value, and, after a predetermined time, V_REF_OUT may be resampled. This is to confirm that a symmetrical leakage is not present. At which point, a determination may again be made whether the V_REF_OUT corresponds to the applied external reference voltage.

Under the assumption that V_REF_OUT does not correspond the applied external reference voltage and with the switch 360 open, the leakage current $I_{LEAK}$ through leakage impedance 342 is substantially equal to $I_{HI}$ minus $I_{LO}$, or, as mentioned above, the current $I_{LEAK} \approx I_{LO} - I_{HI}$. After a time, the reference capacitor 345 may charged to a voltage V_REF that is equal the offset voltage, and the leakage current $I_{LEAK}$ no longer flows, because the currents $I_{HI}$ and $I_{LO}$ return to being substantially equal. After waiting a predetermined time period, the processor may generate another control signal to close the switch 360. The outputs VHI_OUT, VLO_OUT, and V_REF_OUT may be sampled, and the values may be stored in memory. The outputs VHI_OUT and VLO_OUT may be sampled via an ADC, such as ADC 130 shown in FIG. 1. From the values of outputs VHI_OUT and VLO_OUT, the voltage at the battery stack 310 nodes 317 and 315 may be determined, and from the output V_REF_OUT, the offset voltage may be determined. The processor may continue to sample V_REF_OUT to determine when it no longer changes, which occurs when the current $I_{LEAK}$ is approximately equal to the current $I_{LO}$ minus the current $I_{HI}$. Once V_REF_OUT reaches this steady state, the processor samples the outputs VLO_OUT, VHI_OUT and V_REF_OUT, and stores the sampled values in memory. The value of V_REF_OUT will be dependent upon the current $I_{LEAK}$ through reference resistor 347 and reference feedback resistor 349. This latest sample of voltage V_REF_OUT may be used to calculate Rleak since the resistance values of reference resistor 347, and input resistors 302 and 303 may be stored in memory. The latest samples of VHI_OUT and VLO_OUT provide the latest values of the battery node (317 and 315, respectively) voltages. Using the stored samples the voltages of the battery stack 310, the offset voltage and the leakage resistance RLEAK may all be calculated.

An analog-to-digital converter (ADC) (not shown) may be connected to the detection circuit 320 to measure the output signals VHI_OUT, VLO_OUT and V_REF_OUT, digitize the measured values, and output the digitized values to a processor (not shown). The output signals VHI_OUT, VLO_OUT and V_REF_OUT may be sampled continuously, at predetermined intervals, or on a random basis, and the sampled measurements may be stored in memory. The stored measurements may be processed by the processor using, for example, the equations below to determine whether a value of offset voltage relative to symmetrical leakage, RLEAK and the approximate location of the leakage path in the battery stack 310.

Using the sampled measurements, the processor may perform arithmetic operations according to well known principles (such as methods for solving systems of equations containing multiple variables) that use the measurements to determine the presence of a leakage impedance RLEAK, and the values of the offset voltage. The processor, such as that shown in FIG. 1, may analyze the results of the arithmetic operations by comparing the results to stored threshold values. Based on the results of the comparison, the processor may provide an output indicating the presence of a leakage condition of the battery stack 310, or output the determined values of the leakage impedance RLEAK and the offset voltage to an output device. An exemplary method for processing the measurements will be described with reference to the flowchart illustrated in FIG. 4.

After a predetermined time, the output of amplifier 341 is sampled by the processor. In the absence of leakage current $I_{LEAK}$, the voltage V_REF_OUT may substantially correspond to the external reference voltage applied to the non-inverting input of the amplifier 341.

Figure 4:
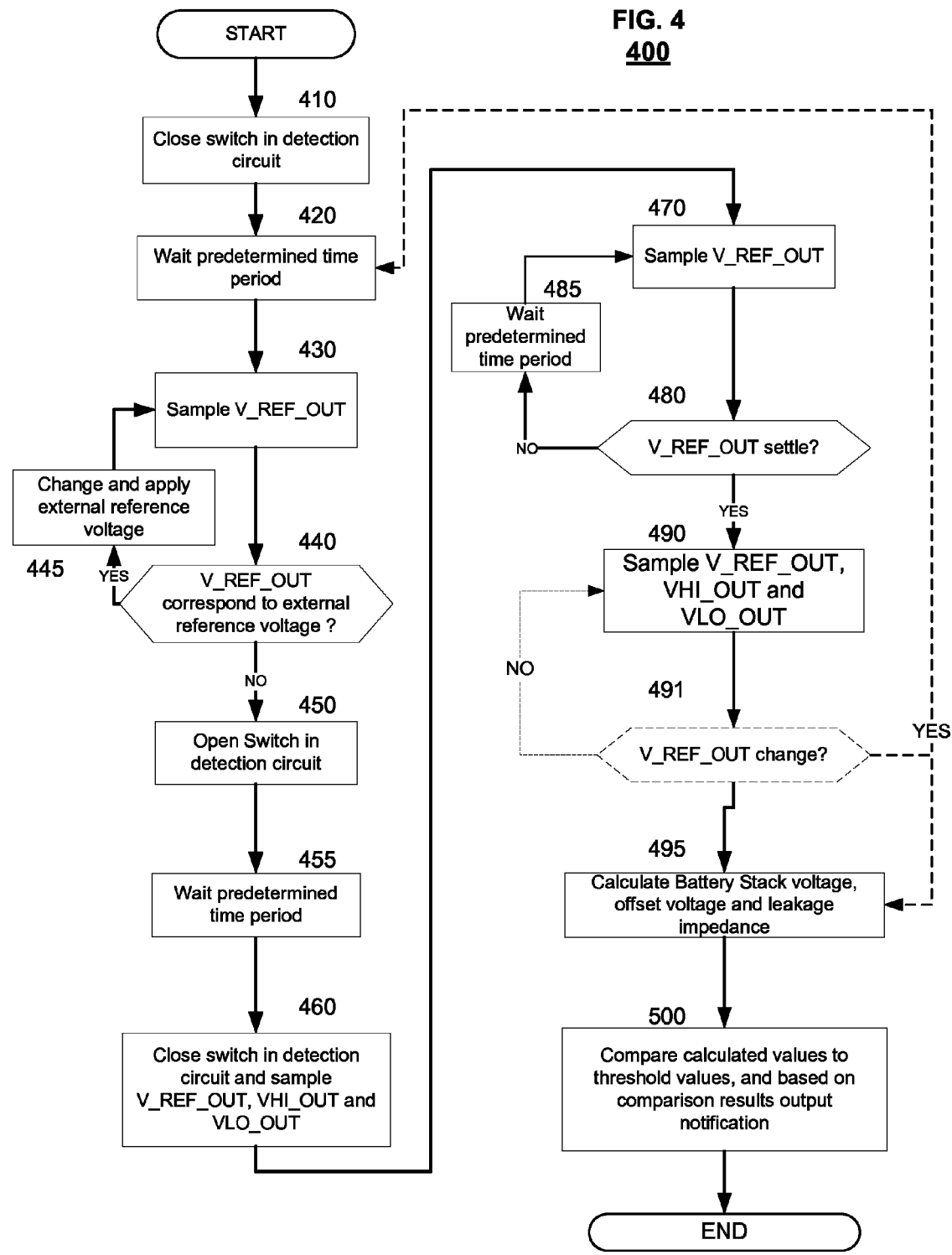
FIG. 4 illustrates an exemplary method according to an embodiment of the present invention.

FIG. 4 illustrates an exemplary method according to an embodiment of the present invention, and will be described with reference to FIG. 3. At step 410 of the exemplary process 400, a processor may generate a control signal to close a switch, such as switch 360, in the detection circuit. The closed switch may connect a reference amplifier and a reference amplifier into the detection circuit. After waiting a predetermined time period at 420, the output V_REF_OUT may be sampled at 430. The output V_REF_OUT will indicate if there is a difference between an applied external reference voltage and a reference voltage node within the detection circuit. A determination may be made by a processor, such as processor 140, whether the sampled V_REF_OUT substantially corresponds to the applied external reference voltage. If the determination is "YES", this may indicate that either no leakage is present or that a symmetrical leakage is present. At step 445, the processor signals a change of the external reference voltage, and steps 420-440 are repeated. If the determination at 440 is "NO", the output V_REF_OUT does not substantially correspond to the applied external reference voltage, the process 400 proceeds to step 450 because this is a determination that a leakage path is present due to the presence of a leakage current.

At step 450, the processor generates a signal to open the switch 360 in the detection circuit. After a predetermined time period expires at 455, the switch 360, at 460, is closed based on a signal from the processor, and almost simultaneously the outputs VLO_OUT, VHI_OUT and V_REF_OUT may be sampled, and the values stored in memory. The process 400 proceeds to 470 at which the reference voltage V_REF_OUT may be sampled. At 480, it may be determined whether V_REF_OUT has settled to a steady value, if not the process 400 waits a predetermined amount of time at 485, and steps 470 and 480 are repeated. When V_REF_OUT is determined to have settled, the process proceeds to step 490. At step 490, the outputs VLO_OUT, VHI_OUT and V_REF_OUT may be sampled, and the values stored in memory. At step 495, the stored sample values may be used to calculate the battery stack 310 voltage, the offset voltage, and the leakage impedance 342.

In an alternative embodiment, step 491 shown in phantom may occur after step 490. Step 491 may perform a check to determine if the value V_REF_OUT changes from its previous sample value. If the answer is YES, it may return to step 420 to repeat the process. Alternatively, if after a predetermined number of iterations or predetermined time period, if a change of V_REF_OUT is not detected, process proceeds to step 495. The values calculated at 495 may be compared at 500, to threshold values that may be stored in memory. Based on the results of the comparison, a notification may be sent to an output device.

Since the resistance values of feedback resistors 312, 313 and 349 are known, a configuration cross check of the detection circuit may be performed using the sampled values VHI_OUT, VLO_OUT and V_REF_OUT to calculate the currents $I_{HI}$, $I_{LO}$ and $I_{LEAK}$, respectively. The difference of the calculated currents $I_{HI}$ to $I_{LO}$, if the circuit is operating properly, may be substantially equal $I_{LEAK}$. Of course, other methods of cross-checking the circuit configuration may be possible.

The method described with respect to FIG. 4 may be programmed and stored as computer instructions in firmware, a state machine, a memory device, or other machine-readable storage medium for execution by the above-described processor, or other device.

Several embodiments of the present invention are specifically illustrated and described herein. However, it will be appreciated that modifications and variations of the present invention are covered by the above teachings and within the purview of the appended claims without departing from the spirit and intended scope of the invention.

Exemplary Equations

Using standard nodal analysis, the following equations may be derived:

Equation 1—Solve for Voff:

$$VOFF = (-)V\_REF \qquad \text{Eq. 1}$$

Equation 2—If Resistor 302 equals Resistor 303, the leakage resistance 342 may be determined by:

$$R342 := -0.5 \cdot \frac{(-2 \cdot R347 \cdot Voff - 2 \cdot R347 \cdot \text{V\_REF} - 1 \cdot \text{V\_REF} \cdot R + V365 \cdot R)}{(-1 \cdot \text{V\_REF} + V365)} \qquad \text{Eq. 2}$$

Notes:
Switch 360 is open (Eq. 1);
Switch 360 is closed (Eq. 2);
Vbatt=311b+311a, and is proportional to VLO_OUT−VHI_OUT (Eq. 1 and Eq. 2);
Voff=Battery offset voltage from symmetry (for example: 311a=25 volts and 311b=75 volts, then Voff=25 volts) (Eq. 1);
Input resistor 302 resistance value equals resistance value of input resistor 303 (Eq. 1 and Eq. 2);
R342 equals the resistance value of the leakage resistance 342 (Eq. 2);
R347 equals the resistance value of the reference resistor 347 (Eq. 2);
V365 equals the voltage value of the external reference voltage supply 365 (Eq. 2);
Voff is the value measured in Eq. 1 (Eq. 2); and
Using different nodal analysis, different equations may be derived and implemented.

I claim:

1. A method for identifying a presence of a leakage path in a multi-cell floating voltage source, comprising:
sampling the voltage of the floating voltage source using a pair of amplifiers connecting in inverting configurations, wherein each of the pair of amplifiers outputs an output signal;
sampling a reference voltage relative to a reference ground potential;
storing the sampled amplifier output signals and the sampled reference voltage in memory;
resample the voltage of the floating voltage source and the reference voltage;
calculating values of a leakage impedance and an offset voltage using the sampled and resampled values;
compare the calculated values of the leakage impedance and offset voltage with threshold values for each of the leakage impedance and offset voltage; and
based on the result of the comparison, generating a notification that a threshold value of any one of the leakage impedance and offset voltage has been exceeded.

2. The method of claim 1, wherein the sampling comprises:
obtaining at an output of an amplifier a difference between a voltage from a terminal of the floating voltage source to a reference voltage source.

3. The method of claim 1, wherein the resampling comprises:
after a predetermined interval, obtaining at an output of an amplifier a difference between a voltage from a terminal of the floating voltage source to a reference voltage source.

4. The method of claim 1, wherein the comparing comprises:
accessing a memory to retrieve stored threshold values of leakage impedance and offset voltage.

5. A system for determining a leakage impedance of a voltage source, comprising:
a floating voltage source formed from multiple voltage cells;
a detection circuit comprising:
a first amplifier and a second amplifier, a first input of the first amplifier connected to a first terminal of the voltage source and the first input of the second amplifier connected to a second terminal of the voltage source, a second input of each of the first and second amplifiers connected to a reference ground potential, and an output of each of the first and second amplifiers connected to a respective first and second output of the detection circuit;
a third amplifier having an input for receiving an external reference voltage; and
a processor for may sampling the outputs of each of the first, second and third amplifiers, and for identifying at least one of a leakage impedance, and an offset voltage from symmetry of the voltage source.

6. The system of claim 5, further comprising:
a isolated power source connected to the first amplifier and the second amplifier, the voltage of the isolated power source based on a value relative to the reference ground potential.

7. The system of claim 6, wherein the detection circuit further comprises:
an analog-to-digital converter having inputs connected to the first and second outputs of the detection circuit for receiving analog signals output from the detection circuit, and having outputs connected to the processor for providing a digital signal converted from the received analog signals.

8. The system of claim 7, wherein the processor further comprises:
inputs for receiving the outputs from the analog-to-digital converter.

9. A circuit for detecting a leakage impedance and leakage voltage of a multi-cell voltage source, comprising:
a first amplifier having a first input connected to a first terminal of the voltage source, a second input connected to a reference capacitor, and an output connected to first output of the circuit;
a second amplifier having a first input connected to a second terminal of the voltage source, a second input connected to the reference capacitor, and an output connected to a second output of the circuit;
a third amplifier having a first input connected to a reference resistor, a second input connected to reference voltage source, and an output connected to a third output, wherein the reference capacitor is connected to a reference ground potential; and
inputs for receiving power from a isolated power source, wherein the inputs are connected to power supply terminals of the first amplifier and the second amplifier, and power provided by the isolated power source is with reference to an isolated ground potential that is different from the reference ground potential.

10. A machine-readable storage medium for storing program instructions that cause a processor to execute a method for identifying a presence of a leakage path in a multi-cell floating voltage source, the method comprising:
sampling the voltage of the floating voltage source using a pair of amplifiers connecting in inverting configurations, wherein each of the pair of amplifiers outputs an output signal;
sampling a reference voltage relative to a reference ground potential;
storing the sampled amplifier output signals and the sampled reference voltage in memory;
resample the voltage of the floating voltage source and the reference voltage;
calculating values of a leakage impedance and an offset voltage using the sampled and resampled values;
compare the calculated values of the leakage impedance and offset voltage with threshold values for each of the leakage impedance and offset voltage; and
based on the result of the comparison, generating a notification that a threshold value of any one of the leakage impedance and offset voltage has been exceeded.

* * * * *